(12) United States Patent  
Schreuder (10) Patent No.: US 7,417,710 B2  
(45) Date of Patent: Aug. 26, 2008

(54) LITHOGRAPHIC APPARATUS AND DEVICE MANUFACTURING METHOD

(75) Inventor: Andre Schreuder, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/234,393

(22) Filed: Sep. 26, 2005

(65) Prior Publication Data

US 2007/0070312 A1 Mar. 29, 2007

(51) Int. Cl.  
G03B 27/42 (2006.01)  
G03B 27/58 (2006.01)

(52) U.S. Cl. .......................... 355/53; 355/72
(58) Field of Classification Search .............. 355/53, 355/30, 72, 75; 356/61; 250/492.1  
See application file for complete search history.

(56) References Cited

U.S. PATENT DOCUMENTS

| | | | |
|---|---|---|---|
| 4,509,852 A | | 4/1985 | Tabarelli et al. |
| 5,010,766 A | * | 4/1991 | Typpo ..................... 73/159 |
| 5,443,932 A | * | 8/1995 | Ohta et al. ................ 430/22 |
| 2002/0041380 A1 | * | 4/2002 | Kwan ...................... 356/616 |
| 2004/0211920 A1 | * | 10/2004 | Derksen et al. .......... 250/492.1 |
| 2004/0263809 A1 | * | 12/2004 | Nakano .................... 355/30 |
| 2006/0033894 A1 | * | 2/2006 | Binnard ..................... 355/30 |

FOREIGN PATENT DOCUMENTS

WO WO 99/49504 9/1999

* cited by examiner

Primary Examiner—Peter B Kim  
(74) Attorney, Agent, or Firm—Pillsbury Winthrop Shaw Pittman LLP

(57) ABSTRACT

A lithographic apparatus includes a liquid supply system to supply an immersion liquid between a downstream lens of a projection system of the lithographic apparatus and a substrate. The lithographic apparatus further includes a closing element to close an underside of the liquid supply system thus preventing leaking of the immersion liquid from the liquid supply system when the substrate is removed from the underside of the liquid supply system. According to an aspect of the invention, an inductive sensor may be used to measure a position of the closing element. The inductive sensor may include an eddy current sensor. A metal foil or other conductive layer may be applied to the closing element. According to an aspect of the invention, a fast return of the closing disc into the holder is now made possible making use of the position of the closing disc as established with the inductive sensor.

23 Claims, 4 Drawing Sheets

LITHOGRAPHIC APPARATUS AND DEVICE MANUFACTURING METHOD

BACKGROUND

1. Field of the Invention

The present invention relates to a lithographic apparatus and a method to handle a closing element of the lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system, i.e. the bottom of the projection system, and the substrate. This enables more accurate projections and imaging of smaller features since the exposure radiation will have a shorter wavelength in the liquid. The effect of the immersion liquid may also be regarded as increasing the effective numerical aperture number NA of the system and also increasing the depth of focus. Other immersion liquids have been proposed, including water with solid particles (e.g. quartz) suspended therein. Thus, a lithographic apparatus may be provided with a fluid provider which is arranged to provide the immersion liquid, or to keep the liquid in its place. The liquid may be flowing to avoid local heating.

The substrate, or the substrate and the substrate table, may be immersed in a bath of immersion liquid. An example of such an arrangement is disclosed in U.S. Pat. No. 4,509,852 which hereby is incorporated by reference in its entirety. Alternatively, the immersion liquid may be provided by a liquid supply system only on a localized area of the substrate and in between the final element of the projection system and the substrate using a liquid confinement system, the substrate generally having a larger surface area than the final element of the projection system. An example of such an arrangement is disclosed in International Patent Application No. 99/49,504 which hereby is incorporated by reference in its entirety. The liquid is supplied by at least one inlet on the substrate, preferably along a direction of movement of the substrate relative to the final element of the projection system, and the liquid is discharged by at least one outlet which may be connected to a low pressure source. Various orientations and numbers of inlets and outlets positioned near the periphery of the final element are possible. Further, a liquid supply system may be provided with a seal member which extends along at least a part of a boundary of the space between the final element of the projection system and the substrate table. The seal member is substantially stationary relative to the projection system in the XY plane though there may be some relative movement in the Z direction (the direction of the optical axis of the projection system). A seal is formed between the seal member and the surface of the substrate. Preferably the seal is a contactless seal such as a gas seal, which may further function as a gas bearing. An example of such an arrangement is disclosed in European Patent Application No. 03252955.4 which hereby is incorporated by reference in its entirety.

European Patent Application No. 03257072.3, which hereby is incorporated by reference in its entirety, discloses a twin or dual stage immersion lithography apparatus. Such an apparatus is provided with two stages for supporting the substrate. Leveling measurements are carried out with a stage at a first position, without the presence of an immersion liquid, and exposure is carried out with a stage at a second position, where an immersion liquid is present. Alternatively, the apparatus has only one stage.

A closing disk may have been provided to close an underside of the liquid supply system when e.g. the substrate is taken away, thereby preventing the immersion liquid to flow away. In a current implementation, the closing disc is held by a holder such as a pocket which may be located in an outside area of a top surface of the wafer stage or substrate table. When illumination of a substrate has taken place, the substrate table may be moved such that the liquid supply system faces the closing disc, thus in other words is positioned over the closing disc by moving the substrate table or stage with respect to the liquid supply system. The closing disc may now be taken out of the holder by the liquid supply system, the closing disc thereby preventing a flowing away of the immersion liquid held by the liquid supply system, as an underside of the liquid supply system is closed thereby. The substrate table may now be taken away from the liquid supply system, to e.g. change the substrate, etc. The closing disc may be held by the liquid supply system by means of under pressure such as by means of vacuum suction. When a following substrate it to be illuminated by the lithographic apparatus, the closing disc may be guided back to the holder, e.g. by moving the substrate table/substrate stage and the liquid supply system with respect to each other such that the closing disc is brought back to the holder again. An issue which comes forward now is that in current implementations, a size of the holder is only marginally larger than a size of the closing disc to keep a gap between the closing disc and the surface of the substrate table/stage to a minimum. This gap is to be kept to a minimum as thereby a leakage of the immersion liquid between the surface of the substrate table/stage and the closing disc may be prevented to a large extent when the substrate table/stage is moved with respect to the liquid supply system such that the position of the liquid supply system changes from facing the substrate to facing the closing disc, whereby the gap between the substrate table and the closing disc is to be passed. Due to this small cap, an accurate positioning of the closing disc is required when the closing disc is positioned back into the holder again. According to the state of the art, this is performed by slowly bringing the closing disc (held by the liquid supply system) and the holder which forms part of the substrate table/stage together until a mechanical contact is established between the closing disc and the holder. Additionally, a position of the closing disc is according to the state of the art measured periodically, e.g. a measurement being performed after a predetermined number of substrates have been illuminated by the lithographic apparatus, an example of such number being 100 illuminations. Such a position measurement is in the state of the art performed by an optical measurement, in particular in that a marker has been located on the closing disc, an optical measurement being performed by the projection system to detect a position of the marker. In a current implementation, the marker comprises a transmission image sensor (TIS) marker, the measurement system comprising a transmission image sensor measurement system. By the measurement, a deviation of an expected position of the closing disc may be corrected. The optical measurement requires a relatively long measurement time, and therefore performing the measurement more frequently would further reduce a speed of the lithographic apparatus.

One of the requirements for future generations of lithographic apparatuses is to increase a number of substrates of wafers that the lithographic apparatus is able to process in a certain time span, in other words to increase a speed or yield of the lithographic apparatus. Efforts are spent to increase a scanning of the substrate, improve accuracy to prevent incorrect illuminations of the substrate, etc. From this view point, the current bringing back of the closing disc to the holder at a low speed may be desirable.

SUMMARY

It is desirable to improve a speed of the lithographic apparatus.

According to an embodiment of the invention, there is provided a lithographic apparatus including a liquid supply system to supply an immersion liquid between a downstream lens of a projection system of the lithographic apparatus and a substrate, a closing element to close an underside of the liquid supply system thus preventing a leaking away of the immersion liquid from the liquid supply system when the substrate is removed from the underside of the liquid supply system, and an inductive sensor to measure a position of the closing element.

In another embodiment of the invention, there is provided a method to handle a closing element in a lithographic apparatus, the method including supplying by a liquid supply system an immersion liquid between a downstream lens of a projection system of the lithographic apparatus and a substrate; closing by the closing element an underside of the liquid supply system thus preventing a leaking away of the immersion liquid from the liquid supply system when the substrate is removed from the underside of the liquid supply system and measuring by an inductive sensor a position of the closing element.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
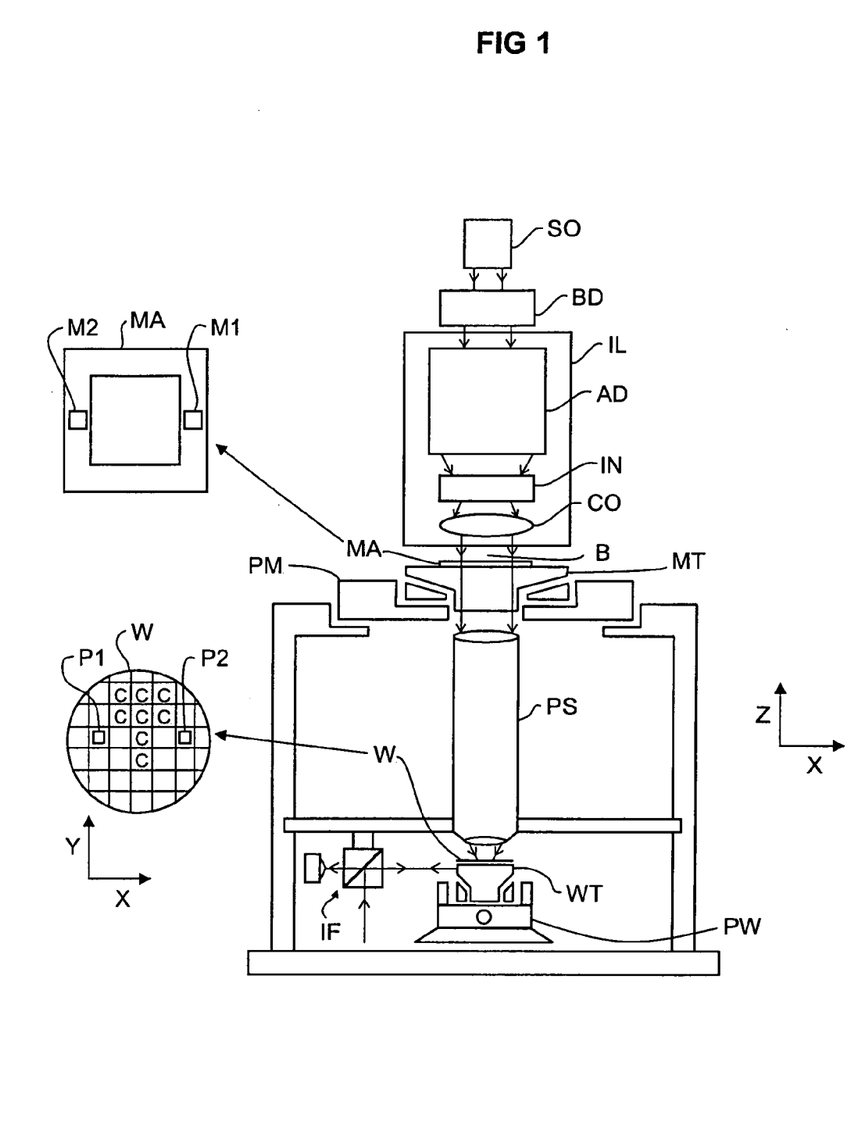
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "Kasumigaseki projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as. used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
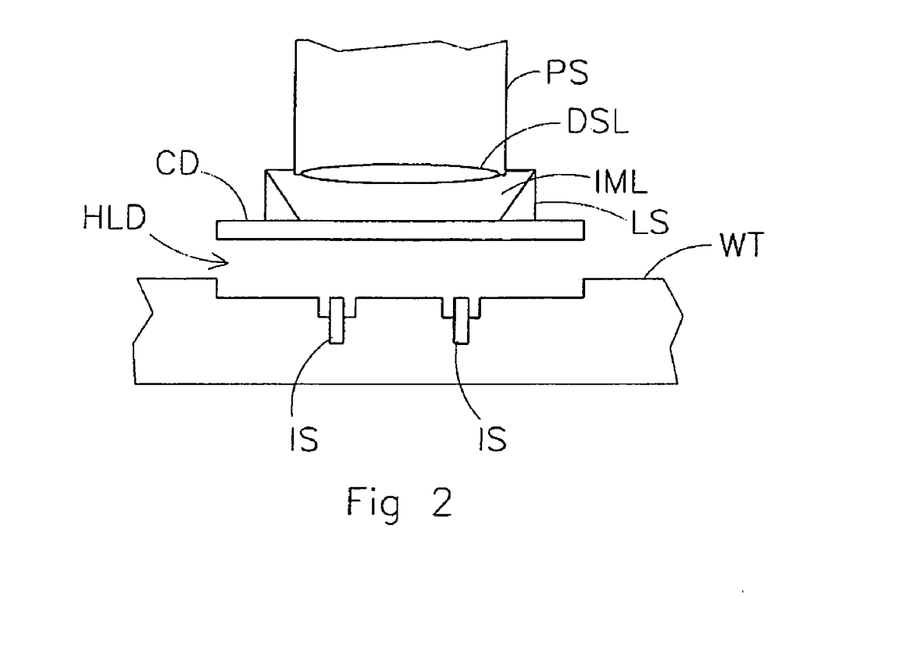
FIG. 2 depicts a schematic view of a part of a lithographic apparatus according to an embodiment of the invention.

FIG. 2 shows a side view, partly in cross section of a part of the projection system PS, the liquid supply system LS and the substrate table WT. FIG. 2 depicts a situation where a closing disc CD closes the liquid supply system LS to prevent a leakage of immersion liquid IML held by the liquid supply system LS. The liquid supply system LS enables to make use of an immersion optics principle by providing the immersion liquid ML between a downstream lens DSL of the projection system PS and the substrate (which is not shown in FIG. 2). The liquid supply system in this schematically depicted embodiment comprises a holder (e.g. a circular holder) to hold the immersion liquid IML. Further, provisions may have been provided to circulate the immersion liquid IML, and to prevent a leakage in a possible gap between the liquid supply system LS and the substrate resp. the closing disc CD. These provisions may comprise an air knife, as well as e.g. a vacuum suction or other under-pressure system to exert an attracting force on the closing disc by the liquid supply system LS. The closing disc CD shown in FIG. 2 is an example of a closing element, the closing element may have any suitable shape, e.g. circular, square, oval, or any other shape matching a dimension and structure of the liquid supply system LS. The immersion liquid IML may comprise any type of liquid such an ultra pure water (UPW) or any liquid having some degree of a transmittivity at a wavelength of the illumination projected by the projection system PS. It is noted that in this document the term substrate table or wafer table as well as the term substrate stage may refer to a same item. As explained previously, the lithographic apparatus comprises a holder HLD to hold the closing disc when not in use. In this embodiment, the holder HLD comprises a recess in the substrate table WT, the recess having a dimension which may be substantially equal to the dimensions of the closing disc CD. More particularly a diameter of the holder HLD may be slightly larger than a diameter of the closing disc, such that a gap between the closing disc and a surface of the substrate table is in an order of magnitude of 0.1-0.2 millimeters or less. Due to the small gap, a leakage of immersion liquid via the gap may be prevented to a large extent. According to an aspect of the invention, the lithographic apparatus may comprise an inductive sensor IS (in this embodiment 2 inductive sensors being shown) to measure a position of the closing disc CD. The inductive sensor IS now allows to measure a position of the closing disc when approaching the holder HLD, for example when the substrate table WT is raised towards the liquid supply system as to move the holder HLD towards the closing disc CD. According to the state of the art, a slow movement is used, as due to tolerances in a position of the closing disc with respect to the holder HLD, the closing disc may otherwise crash against the substrate table WT thereby causing damage to the substrate table comprising the holder and/or the closing disk. According to this aspect of the invention, the inductive sensor enables to measure a position of the closing disc, thereby enabling an accurate positioning of the holder HLD and the closing disc CD with respect to each other to bring the closing disc CD into the holder HLD accurately. Due to this increase in accuracy, a risk of a collision between the closing disc CD and the holder HLD, an edge of the holder or another part of the substrate table, may be reduced, thus allowing to bring the holder and the closing disc towards each other at a higher speed, in particular when the holder HLD and the closing disc are that close to each other that due to a mismatch in a position, tolerances, etc. a collision might occur in the implementation according to the state of the art. Therefore, in a usual procedure in the state of the art wherein the closing disc and the holder are first brought together at a relatively high speed and then, when these elements are approaching each other, the speed is significantly reduced, this speed reduction may be omitted, thus shorting a time to place the closing disc in the holder. Thus, by measuring the position of the closing disk with respect to the holder e.g. every time the closing disk is brought back into the holder, a speed of bringing the closing disk and the holder together may be increased. As the closing disk may now be placed in the holder at a higher speed, an overall time required to process a substrate may be reduced to some extent, and thereby a total number of substrates to be processed by the lithographic apparatus in a predetermined time span may be increased. Further, an advantage of the inductive measurement principle is that it may be used with any type of projection system, including e.g. a projection system having a numerical aperture of more than 1. The optical position measurement system according to the state of the art would not function with such a numerical aperture. Also an advantage of the inductive measurement principle is that is may be applied "on the fly", thus e.g. when the closing disk is approaching the holder. Therefore, multiple measurements may be performed during a bringing of the closing disk into the holder thus further increasing a positioning accuracy and/or allowing to further increase a speed with which the closing disk and the holder may approach each other.

According to an aspect of the invention, the closing disk, when approaching the holder, is thus first taken over by the holder (e.g. by means of a vacuum force or other force), and only then a mechanical contact between the closing disk and the holder is established. The position of the closing disk may be measured before, during and/or after the taking over. The term taking over may be understood here as a transition between a state wherein the closing disk is held by the liquid supply system to a state where the closing disk is held by the holder. This taking over may also be referred to in this document as a transfer. Advantages such as a faster bringing back the closing disk into the holder have been outlined above. Further to the advantages mentioned above, a drift in the positioning of liquid supply system, closing disk and/or holder which drift could occur when taking over the closing disk on the fly (thus before establishing a mechanical contact between the closing disk and the holder), may be prevented and/or taken into account due to the position measurement by e.g. the inductive sensor.

Figure 3A:
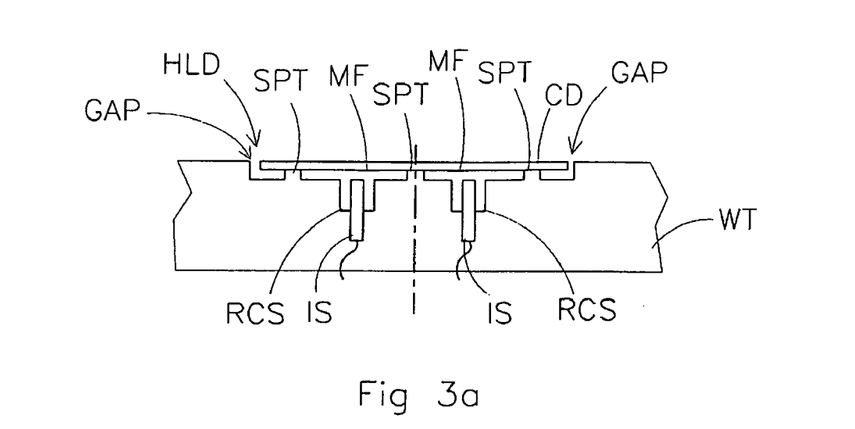
FIGS. 3a and 3b depict a partly cross sectional side-view and top view of a holder and a closing element of a lithographic apparatus according to an embodiment of the invention.
Figure 3B:
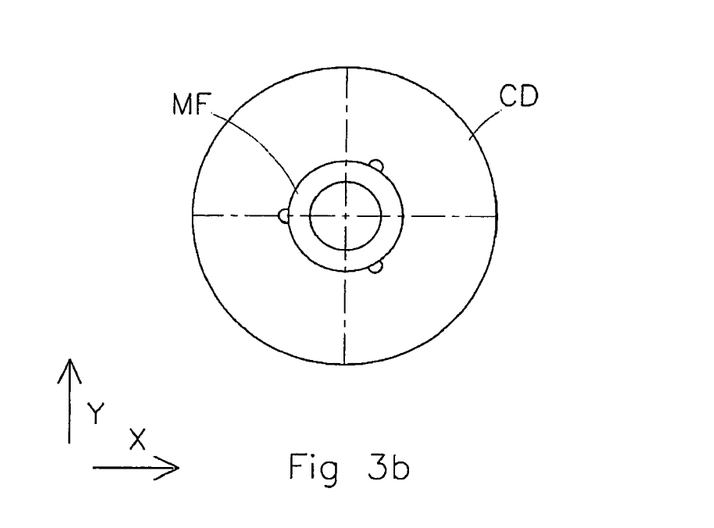

Generally speaking, advantage of making use of an inductive sensor to measure a position of the closing disk is that the inductive sensor is insensitive to a presence of a liquid as well as to a liquid vapor. A handling of the closing disk may thereby be made more fast, as the inductive sensor allows for a fast position measurement of the closing disk and as position tolerances which may necessitate a slow handling of the closing disk to prevent damage thereto by collisions, may be prevented. In the environment described here, a risk of some leakage of immersion liquid is present, and furthermore some immersion liquid may be present in a form of an immersion liquid vapor. A common measurement principle in lithography to measure a distance or position is optical a measurement, making use of e.g. an encoder or an interferometer. A disadvantage of optical measurement principles in general is however that they tend to be sensitive to liquid as well as liquid vapor, a presence of which could disturb a position measurement of the closing disc. A same holds for another measurement principle, being a capacitive distance measurement, which also shows sensitivity to liquid as well as liquid vapors. Commonly, inductive sensors are applied for proximity measurements, e.g. in a form of a proximity switch. Also, applications where an inductive sensor is used for a distance measurement towards an object are known. One of the parameters which plays a role here is however not only a distance towards the closing disc, but also a lateral position, in other words a position of the closing disc with respect to the holder in a plane substantially parallel to the surface of the closing disc. The inventors have now realized that an inductive sensor is not only insensitive to the immersion liquid and immersion liquid vapors which may be used in a lithographic apparatus, but also that such an inductive sensor may be used to measure a position of the closing disc in the dimensions mentioned above. Of course, in case that the immersion liquid would contain impurities such as salts, which would cause the immersion liquid to have a certain conductivity, then disturbances of the inductive measurement principle could come forward, however in lithography requirements as to a purity of the immersion liquid are high, which causes such effects to play a minor role only. Thus, the handling of the closing disk may be made more accurate, as the inductive sensor is insensitive to influences due to immersion liquid vapor, immersion liquid droplets, etc. The inductive sensor comprises a capture area, i.e. an area in which a position measurement of the closing disc may be performed: in case that the closing disc is to far away, a signal obtained from the inductive sensor may be that weak that no measurement may be performed. A size of the capture area depends on a construction of the inductive sensor. In the embodiment shown in FIG. 2 a capture area in an order of magnitude of one or more millimeters may be obtained. The capture range may extend in the z direction as well as in the x,y plane. The inductive sensor may comprise any type of inductive sensor, such as an eddy current sensor. Other examples of inductive sensors include sensors which measure an impedance of a coil generating an electromagnetic field. The impedance of the coil changes due to a presence of a ferromagnetic material. This measurement principle is thus selective in that only ferromagnetic materials are detected, while the eddy current measurement principle responds to any type of conductive material, as eddy currents are induced in any conductor. To detect the closing disc by the inductive sensor, the closing disc may comprise a metal foil or any other conductive layer, which may for example be ring-shaped such as shown in FIG. 3b. FIG. 3b shows a top view of a closing disc, partly in see through view, showing a ring-shaped metal foil MF which is in this example concentric with the closing disc CD. FIG. 3a shows a side view in cross-section of the closing disc CD held by the holder HLD in the substrate table WT. Due to the metal foil, a defined amount of metal is present in the area in which the inductive sensor is sensitive, i.e. in the sensor capture area, thus providing for a defined sensitivity of the inductive sensor. It is remarked that, where in this document the term metal foil is used, this may be understood as an example of any electrically conductive layer. Thus, instead of or in addition to the metal foil, any conductive layer may be applied. An advantage of a ring-shaped metal foil or ring shaped conductive layer is that it allows a precise position measurement: when moving the closing disc in a plane which substantially coincides with a surface of the closing disc then, as can be easily seen from FIG. 3b, one or more of the inductive sensors will be covered to a larger extent by the ring shaped foil or layer while one or more of the others will be covered less. Thus, the sensors that are covered more will provide an altered measurement value that signals a presence of more of the metal foil or conductive layer, while the other or others will provide a measurement value indicating the opposite. Furthermore, by the circular shape a rotation of the closing disc (which may in this context be irrelevant) will not result in a change of the measurement, thus not unnecessarily complicating the position measurement. As shown in FIG. 3b, in this embodiment the inductive sensor comprises 3 eddy current sensors which are positioned equidistantly around a circumference of an imaginary circle, the circle being substantially coaxial with the ring-shaped metal foil or conductive layer of the closing disc when held by the holder. Thereby, a deviation in position of the ring-shaped metal foil or conductive layer from the nominal, desired position as shown in FIG. 3b may be easily detected as it results in an increased output of at least one of the sensors and a decreased output in another one or more of the sensors. To achieve an optimum sensitivity, it is desirable that an outer diameter of the ring-shaped metal foil or conductive layer approximately corresponds to a diameter of an imaginary circle, which crosses a center of each of the inductive sensors, as is depicted in FIG. 3b. The principle described here may also be easily understood from FIG. 3a. FIG. 3a shows a side view in cross section of the substrate table WT, the holder HLD in which the closing disc CD is positioned and two inductive sensors IS. The holder comprises recesses RCS in which the inductive sensors IS are positioned. Further, supports SPT are provided which support the closing disc CD when held by the holder. Due to the supports SPT, a gap between a bottom of the holder HLD and an underside of the closing disc CD is provided, which may be used to advantage to e.g. suck away any immersion liquid which has leaked e.g. into the gap between the closing disc CD and the surface of the substrate table. Furthermore, a vacuum suction or other under pressure means may be provided to pull the closing disc CD into the holder HLD, thus to pull the closing disc CD onto the supports SPT. As described above with reference to FIG. 3b, the metal foil MF which is in FIG. 3a placed at an underside of the closing disc CD, has an outer diameter which positions a sector of the foil with approximately one half coverage over the inductive sensor IS. A displacement of the closing disc CD to the left or right in the plane of drawing will thereby result in an increased coverage by one of the inductive sensors and a decreased coverage of the metal foil by another one of the sensors. Therefrom, position information on the position on the closing disc CD may be derived. The principle described here may be applicable with one or more sensors, however, this principle is in particular advantageous when at least 3 eddy current sensors (or in general 3 inductive sensors) are used, as they enable to determine the position of the closing disc in at least 3 degrees of freedom making use of the measurement values of the 3 or more sensors. In general, applying n inductive sensors, the position of the closing disc may be determined in n degrees of freedom. The 3 degrees of freedom may comprise the position of the closing disc in X, Y and Z dimension, while for other degrees of freedom (a rotational position of the closing disc with respect to the X, Y and/or Z axis) use may be made of position information derived from another source, such as the position of the substrate table when the closing disc is held by the holder in the substrate table resp. the position of the liquid supply system LS when the closing disc CD is held by the liquid supply system as depicted in FIG. 2. Thereby, the lithographic apparatus thus determines the position of the closing disc from the measurement values of the inductive sensors and a position of at least one of the substrate table and the liquid supply system. As the closing disc is mostly held by either the holder (in this example comprised in the substrate table WT) or the liquid supply system, a position of the one of the substrate table and the liquid supply system holding the closing disc at a particular moment in time may be used in the determination of the position of the closing disc at that moment in time.

In the example described here where 3 inductive sensors are used, 3 measurement values are obtained which make it possible to determine a position of the closing disc therefrom in X, Y and Z dimension. Thereby, use is made of the fact that the inductive sensor shows a sensitivity for a position of the metal of the closing disc in the X, Y plane, but also in the Z plane. Commonly, this is considered disadvantage, as a change in an output of the sensor may be a result of a change in a position in X, Y plane but also due to a change in a position with respect to the Z axis thereby introducing an ambiguity As according to this aspect of the invention use is made of sensor outputs of 3 inductive sensors for example in the configuration shown here, the effect of a sensitivity in X, Y and Z dimension of the sensors may be used to advantage to determine the position of the closing disc (or more precisely the position of the metal ring) in the 3 dimension.

Figure 4:
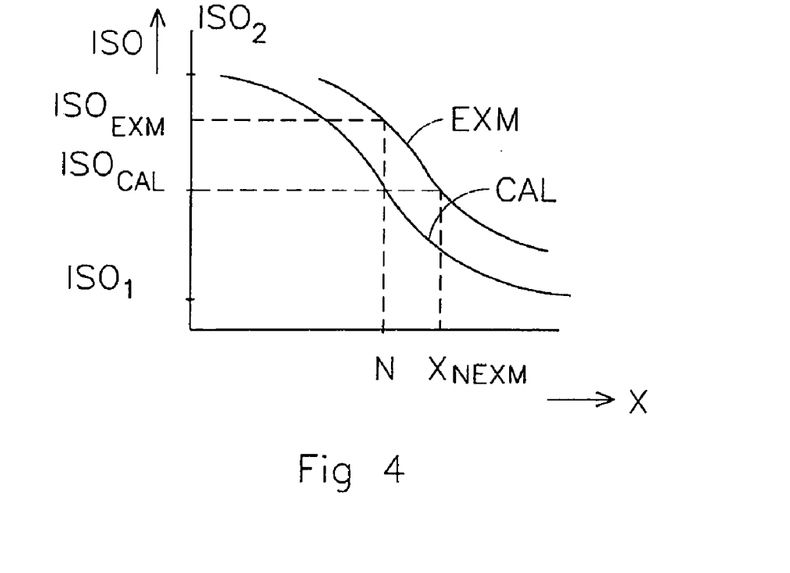
FIG. 4 depicts a graph of a readout of a sensor according to an aspect of the invention versus a position of the closing element.

FIG. 4 shows a sensor output curve where along a vertical axis a read out of the sensor (indicated here as inductive sensor output ISO) and along the horizontal axis a position of the closing disc (in general the closing element) along an X axis is depicted. In this document, the X axis corresponds to an axis in a plane substantially parallel to a focus plane of the projection system PS, which substantially corresponds to a plane in which a scanning movement or stepping movement is performed, as has been explained above with reference to FIG. 1. A nominal position of the closing disc is indicated by n, which may correspond to the positions as shown and described with reference to FIGS. 3a and 3b. FIG. 4 shows a calibration curve CAL which may correspond to an average response over a plurality of inductive sensors, and an example of an exemplary curve EXM depicting a response of an example of an inductive sensor. The symbol N indicates that at the nominal position N, an output $ISO_{cal}$ is provided, while a position deviation results in a larger or smaller inductive sensor output ISO. This is due to the fact that a displacement of the closing disc along the X axis will result in more or less coverage of the closing disc with respect to the inductive sensor, thus providing a change in output thereof.

As shown in FIG. 4, the calibration curve CAL shows a flattening at both ends thereof which is due to the fact that after some displacement of the closing disc a coverage of the closing disc with respect to the respective inductive sensor tends to go towards either $ISO_1$ (the inductive sensor being fully covered by the metal ring) or $ISO_2$ (the metal ring not covering the respective inductive sensor at all in that position). Values of $ISO_1$ and $ISO_2$ depend on characteristics of the eddy current sensor as well as on a presence of other conductive materials (an example of which may include a flow plate in the liquid supply system, the flow plate to e.g. guide a flow of the immersion liquid). To be able to cope with a relatively large amount of exemplary spread of inductive sensors, a calibration mechanism may be used as described below. According to an aspect of the invention, a simple yet effective calibration mechanism may be provided by providing the calibration curve as depicted in FIG. 4, the calibration curve corresponding to an average, typical response of the inductive sensor. As a function of position of the closing disc in e.g. X dimension. The calibration curve may be stored in a memory of the lithographic apparatus. Further, for each inductive sensor an offset may be stored, the offset to express a difference between the calibration curve CAL at an exemplary curve EXM, an example of which being depicted in FIG. 4. The offset may correspond to an output offset, i.e. being expressed as an difference between an output of the typical sensor at the nominal position, i.e. $ISO_{cal}$ and an output of the exemplary sensor at the same position being depicted in FIG. 4 as $ISO_{exm}$. Also, it is possible that the offset is expressed in terms of a difference in position, i.e. an offset between the nominal position and the position $X_{nexm}$ which position provides a same output at the exemplary sensor as the nominal sensor (expressed by the calibration curve CAL) would have provided at the nominal position n. The offset thus enables the lithographic apparatus to adapt the calibration curve for the specific sensor such that, by adding the offset to the calibration curve a curve is obtained which coincides with the exemplary curve EXM to a large extend. Thereby, a calibration of each of the inductive sensors is simplified, as only a single calibration curve may be stored in the lithographic apparatus, while for each of the sensors only an offset is required to be stored to determine a curve for that specific sensor from the calibration curve and the offset. It is to be noted that FIG. 4 shows along a horizontal axis an X dimension. Therefore, the example shown in FIG. 4 may be seen as a calibration for the most left sensor in the plane of drawing of FIG. 3b, as a displacement of the closing disc CD with respect to the X axis fully translates into a more or less coverage of the metal foil over the inductive sensor shown at the left. For the other two inductive sensors shown in FIG. 3b, a similar calibration may be used, provided that the displacement which is depicted in FIG. 4 as a displacement along the X axis, may be seen for these sensors as a displacement along an axis which is rotated with respect to the X axis by 120 degrees in the X, Y plane, i.e. an axis which intersects the respective sensor at a center thereof and which intersects a center of the imaginary circle around which circumference the sensors are positioned equidistantly.

Figures 5A, 5B:
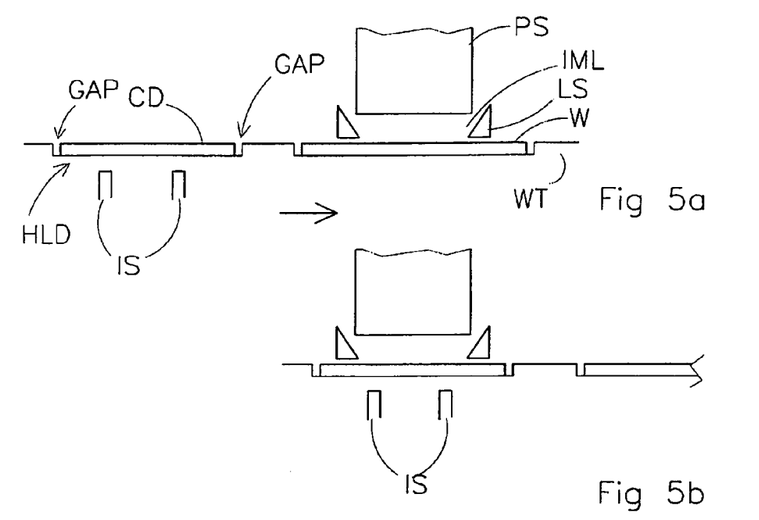
FIGS. 5a-5d depict step by step a handling of the closing element according to an embodiment of the invention.
Figure 5C:
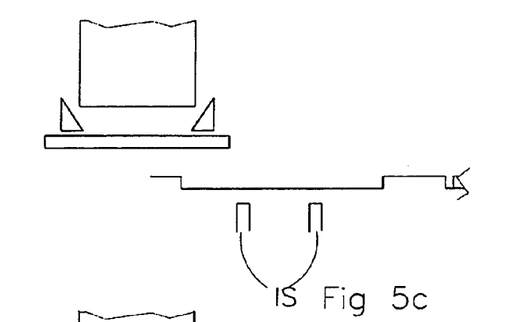
Figure 5D:
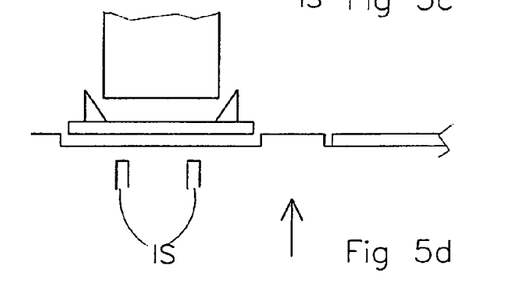

A further aspect of the invention is now described with reference to FIGS. 5a-5d. FIG. 5a-5d consecutively show steps in a taking out of the closing disc by the liquid supply system and a bringing back of the closing disc into the holder by the liquid supply system. FIG. 5a shows a part of a substrate table WT holding a substrate W. A projection system PS may project a patterned beam of radiation to the substrate W via the immersion liquid IML held by the liquid supply system LS. Further, FIG. 5a shows the closing disc CD hold by the holder HLD in the substrate table WT. When an irradiation of the substrate WS has been finalized and the substrate W is e.g. to be exchanged, the substrate table WT may not be simply taken away because then the immersion liquid IML would leak out of the liquid supply system LS. Therefore, the substrate table is first moved to the right in the plane of drawing, the movement to the right being with respect to the projection system and the liquid supply system LS which results in the situation shown in FIG. 5b, where the projection system and the liquid supply system LS instead of facing the substrate table WT now face the closing disc CD which is held in the holder HLD of the substrate table WT. The closing disc may be held into the holder HLD by a force e.g. via a vacuum suction or other under pressure means to pull the closing disc into the holder, thereby preventing a loosening thereof in case of movements, accelerations, etc. of the substrate table WT. The liquid supply system LS may also be equipped with a vacuum suction or under pressure means to attract the closing disc. In the position shown in FIG. 5, the vacuum suction by the substrate table may be reduced while at the same time a vacuum suction by the liquid supply system onto the closing disc may be exerted which pulls the closing disc towards the liquid supply system. Then, as shown in FIG. 5c, the substrate table WT may be moved away, if required, from the projection system, e.g. to swap substrate tables, to swap substrates etc. As a following, as depicted in FIG. 5d, the substrate table or another substrate table after a substrate table swap is moved towards the liquid supply system and the closing disc. As explained previously, a gap between the holder and the closing disc may be very narrow to prevent a leaking of the immersion liquid when moving the substrate table from the position shown in FIG. 5a to the position shown in FIG. 5b and vice versa. Therefore, an accurate positioning of the holder HLD, and thus an accurate positioning of in this example the substrate table WT is required to bring the closing disc back into the holder. According to an aspect of the invention, the position of the closing disc is measured by the inductive sensors IS in the situation shown in FIGS. 5a and/or 5b. Thus, the position of the closing disc is measured when in the capture range of the inductive sensors. In FIG. 5c, the liquid supply system, closing disc and the holder are moved towards each other to bring the closing disc back into the holder, which according to an aspect of the invention is accomplished making use of the position of the closing disc as has been measured previously in the situation as described with reference to FIGS. 5a and 5b. The inventors have realized that after taking the closing disc out of the holder by the liquid supply system LS, the closing disc will not or substantially not be subjected to any displacements with respect to the liquid supply system LS. As the position of the liquid supply system may be known in the lithographic apparatus anyway by a suitable position measurement system, a position relation between the position of the liquid supply system and the position of the closing disc when held by the liquid supply system such as depicted in FIG. 5c, does not or not substantially change. As in FIG. 5b the position of the liquid supply system LS as well as the position of the closing disc CD are known, the position relationship there between may be established. Therefore, when bringing back the closing disc to the holder as depicted in FIG. 5d, a position relationship between the holder and the closing disc may be derived from the position as measured in FIG. 5b in that the the position of the closing disc with respect to the liquid supply system has been established as described above, which enables when bringing back of the closing disc to the holder to establish the position relationship between the closing disc and the holder because the position of the substrate table is measured in the lithographic apparatus anyway, the position of the liquid supply system is also known in the lithographic apparatus, and the position relationship between the liquid supply system and the closing disc has been established as described here. Therefore, it is now made possible to bring the closing disc back into the holder at a substantially higher speed than previously, as the position relationships can now be established due to the fact that the position of the closing disc has been measured before taking the closing disc out of the holder. In the situation shown in FIG. 5b, it is even possible to measure the position of the closing disc during a transfer of the closing disc from the holder to the liquid supply system, thus when taking the closing element out of the holder. Thereby, any position inaccuracy which could come forward as a result of the taking over of the closing disc by e.g. a vacuum suction forces may be taken into account, thereby further increasing an accuracy of the position measurement of the closing disc. In addition or instead of the measurement of the position of the closing disk as described above with reference to FIGS. 5a and 5b, the measurement of the position by the inductive sensors may be repeated in the situation shown in FIG. 5d when the closing disc is in the sensor capture area near the holder again, thus to again measure the position during a final stage of the moving of the closing element back into the holder. Thereby again accuracy may be increased and any measurement tolerances or other causes which may have resulted in a displacement of the closing disc with respect to e.g. the liquid supply system may be taken into account to e.g. correct a position of the substrate table in which the holder is comprised. In general, by the inductive sensors IS it is now possible to measure a position of the closing disc when in the holder, when bringing the closing disc back to the holder and/or when taking the closing disc out of the holder which enables to highly accurately establish a position of the closing disc with respect to the holder thus enabling a fast handling of the closing disc to save time as thereby a processing of a following substrate may be started at an earlier moment in time. Also, a risk of damage due to crashes of the closing disc against the holder, substrate table, etc, may be reduced to a large extent.

In a practical embodiment a depth of the holder may be 300 micrometers, and due to the accurate positioning of the closing disc which is made possible by the measurement by the inductive sensors, a bringing of the closing disc into the holder is made possible at a high speed between the lower surface of the closing disc and the supports SPT as shown in FIG. 3a remains until a gap which is equal to approximately 100 micrometers. From this position on, a vacuum suction means of the holder starts to exert a force onto the closing disc to pull the closing disc further into the holder, while a vacuum force exerted by the liquid supply system to pull the closing disc to the liquid supply system may be diminished or stopped at a same moment in time. Now, the closing disc may be "handed over" from the liquid supply system to the holder. During which it is again possible to perform measurements by the inductive sensors. The inductive sensors may comprise coils which generate an alternating electromagnetic field causing eddy current sensors to be generated in the metal foil on other conductive part of the closing disc, which sensing principle is commonly indicated as an eddy current sensor. Due to the presence of eddy current sensors in e.g. the foil, an impedance of the foil may change which may be read out by suitable electronic circuitry. Also, it is possible that due to the eddy current sensors, an impedance characteristic or an inductance characteristic of the coil changes which results in e.g. a change in a frequency of the electromagnetic field generated by the respective coil.

As a further aspect of the invention, the position sensing by the inductive sensors enable to perform cross-calibrations, as in the system described in particular with reference to FIGS. 5a-d a correlation between a variety of position measurements may be established. For example in the position depicted in FIG. 5b, the position of the liquid supply system may be known from a liquid supply system position measurement system comprising liquid supply system position sensors. The position of the substrate table may be known from a substrate table position measurement system comprising substrate table position sensors such as the interferometers and/or encoders described with reference to FIG. 1. The inductive sensors now also enable to establish a position relationship between the substrate table and the closing disc. As in FIG. 5b the liquid supply system may be held against the closing disc, a chain of position measurements comes into existence which enables to verify these measurements against each other thus being able to find any inconsistencies there between. If for example the position of the substrate table as measured by the position measurement system described in FIG. 1 is taken as a reference, the inductive sensors may relate the position of the closing disc to that reference. Now that the liquid supply system is in the situation shown in FIG. 5b held against the closing disc, the position measurement by the liquid supply system position sensors should match the position of the closing disc to some extent, and if that would not be the case, then an error in for example the position measurement of the liquid supply system may have come into existence. If such an inconsistency between the various position measurements is signaled by the lithographic apparatus, this may be a reason to start up a calibration procedure by the lithographic apparatus or to perform additional measurements for finding a cause of the inconsistency and/or for re-calibrating position measurements of one or more of the liquid supply system, the substrate table and the closing disc.

The conductive layer or metal foil of the closing disc may comprise any type of conductive material, examples including a metal such as a ferromagnetic metal of any other metal. Examples include copper, aluminum, iron, etc. A sensitivity of the eddy current sensor depends on a conductivity, a magnetic damping, a thickness, a positioning etc of the layer or foil. Alternatively or in addition to the foil, the closing disc may comprise any other conductive part in which a current may be induced. A frequency of operation of the inductive sensor, i.e. a frequency of the electromagnetic field generated by the inductive sensor may have any value, and the frequency may be chosen such that a sufficiently high sensitivity is obtained, i.e. a sufficient output of the inductive sensor is obtained as a result of a displacement of the closing disc.

It is remarked that in this document the term substrate table WT has been used as well as the term chuck. In the context of this document, the term substrate table may refer to a same item as what may be referred to as chuck, i.e. an assembly of a mirror block (on which e.g. interferometers beams of the position sensor IF may be reflected) and a table which is mounted thereto, the table to hold the substrate. Alternatively, the table may form a integral part of the chuck. The chuck may further comprise non-stationary parts of the positioner PW as described with reference to FIG. 1. Further, it is noted, that in the context of this document, the chuck may also have been referred to as a stage. Thus, in the context of this document, the terms substrate table, wafer table, stage and/or chuck may refer to what is in the art known as a stage or a chuck. Further, it is noted that the table which holds the substrate does not necessarily form an integral part of the stage or chuck, contrarily the table which holds the substrate (and which may also be referred to as substrate table) may also consist of a separate entity which may be connectable to the stage or chuck.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms Kasumigaseki ents, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a liquid supply system to supply an immersion liquid between a downstream lens of a projection system of the lithographic apparatus and a substrate;
    a closing element to close an underside of the liquid supply system so as to prevent a leaking away of the immersion liquid from the liquid supply system when the substrate is removed from the underside of the liquid supply system; and
    an inductive sensor to measure a position of the closing element.

2. The lithographic apparatus according to claim 1, wherein the inductive sensor is located in a holder constructed and arranged to hold the closing element, wherein the inductive sensor is constructed and arranged to provide a sensor capture area proximate the holder and to measure the position of the closing element in the sensor capture area proximate the holder.

3. The lithographic apparatus according to claim 2, wherein the inductive sensor comprises an eddy current sensor.

4. The lithographic apparatus according to claim 3 wherein the closing element comprises a conductive layer.

5. The lithographic apparatus according to claim 4, wherein the conductive layer is ring shaped.

6. The lithographic apparatus according to claim 5, wherein the inductive sensor comprises at least two eddy current sensors positioned substantially equidistantly around a circumference of an imaginary circle, the circle being substantially coaxial with the ring shaped conductive layer of the closing element when held by the holder.

7. The lithographic apparatus according to claim 6, wherein the inductive sensor comprises three eddy current sensors, the lithographic apparatus further being constructed and arranged to determine the position of the closing element in three degrees of freedom making use of measurement values of the three eddy current sensors.

8. The lithographic apparatus according to claim 6, wherein the lithographic apparatus is constructed and arranged to determine the position of the closing element from measurement values of the at least two eddy current sensors and a position of at least one of the substrate table and the liquid supply system.

9. The lithographic apparatus according to claim 2, wherein the lithographic apparatus is arranged to:
    measure the position of the closing element with the inductive sensor, when the closing element is in the sensor capture area proximate the holder,
    take the closing element out of the holder to close the liquid supply system, and
    move the closing element back to the holder making use of the position as measured with the inductive sensor.

10. The lithographic apparatus according to claim 9, wherein the lithographic apparatus is arranged to measure the position of the closing element during a transfer of the closing element between one of the liquid supply system and the holder and the other one of the liquid supply system and the holder.

11. The lithographic apparatus according to claim 10, wherein the lithographic apparatus is arranged to again measure in a sensor capture area proximate the holder the position of the closing element during the transfer of the closing element back to the one of the liquid supply system and the holder.

12. The lithographic apparatus according to claim 1, wherein the lithographic apparatus is constructed and arranged to determine the position of the closing element from the measurement value of the inductive sensor and a position of at least one of the substrate table and the liquid supply system.

13. The lithographic apparatus according to claim 1, wherein the lithographic apparatus is constructed and arranged to obtain the measurement value for the inductive sensor from a read out of the inductive sensor, a calibration curve stored in a memory of the lithographic apparatus, and an offset of the inductive sensor, the offset being stored in the memory of the lithographic apparatus.

14. A method to handle a closing element in a lithographic apparatus, the method comprising:
supplying by a liquid supply system an immersion liquid between a downstream lens of a projection system of the lithographic apparatus and a substrate;
closing by the closing element an underside of the liquid supply system to prevent a leaking away of the immersion liquid from the liquid supply system when the substrate is removed from the underside of the liquid supply system; and
measuring by an inductive sensor a position of the closing element.

15. The method according to claim 14, wherein the inductive sensor is located in a holder to hold the closing element, the inductive sensor to measure the position of the closing element in a sensor capture area near the holder.

16. The method according to claim 14, wherein the inductive sensor comprises three eddy current sensors, and the measuring of the position of the closing element comprises determining the position of the closing element in three degrees of freedom making use of measurement values of the three eddy current sensors.

17. The method according to claim 14, wherein the inductive sensor comprises at least two eddy current sensors, and the measuring of the position of the closing element comprising determining the position of the closing element from measurement values of the at least two eddy current sensors and a position of at least one of the substrate table and the liquid supply system.

18. The method according to claim 14, comprising determining the position of the closing element from the measurement value of the inductive sensor and a position of at least one of the substrate table and the liquid supply system.

19. The method according to claim 14, comprising obtaining the measurement value for the sensor from a read out of the respective sensor, a calibration curve stored in a memory of the lithographic apparatus, and an offset of the respective sensor, the offset being stored in the memory of the lithographic apparatus.

20. The method according to claim 14, comprising:
measuring the position of the closing element with the inductive sensor, when in the capture range near the holder;
taking the closing element out of the holder to close the liquid supply system; and
moving the closing element back to the holder making use of the position as measured with the inductive sensor.

21. The method according to claim 20, comprising measuring the position of the closing element during a transfer of the closing element between one of the liquid supply system and the holder and the other one of the liquid supply system and the holder.

22. The method according to claim 21, comprising again measuring in a sensor capture area near the holder the position of the closing element during the transferring of the closing element back to the one of the liquid supply system and the holder.

23. The method according to claim 14, wherein the inductive sensor comprises an eddy current sensor.

* * * * *